United States Patent [19]

Diller et al.

[11] Patent Number: 4,684,881
[45] Date of Patent: Aug. 4, 1987

[54] LOW IMPEDANCE SWITCHED ATTENUATOR

[75] Inventors: Calvin D. Diller, Hillsboro; Michael J. Burke, Beaverton, both of Oreg.

[73] Assignee: Tektronix, Inc., Beaverton, Oreg.

[21] Appl. No.: 908,836

[22] Filed: Sep. 17, 1986

[51] Int. Cl.$^4$ .................. H03H 5/00; H01C 10/50
[52] U.S. Cl. .................. 323/354; 333/81 R; 338/201
[58] Field of Search .................. 323/297, 353, 354; 338/60, 200, 201; 333/81 R

[56] References Cited

U.S. PATENT DOCUMENTS 3,403,324  9/1968  Bradley .................. 323/354
3,519,930  7/1970  Bradley .................. 323/354
3,898,593  8/1975  Qureshi .................. 323/354

FOREIGN PATENT DOCUMENTS 2048202  4/1972  Fed. Rep. of Germany .... 333/81 R
147756  11/1979  Japan .................. 333/81 R Primary Examiner—William H. Beha, Jr.
Attorney, Agent, or Firm—John P. Dellett; George T. Noe

[57]  ABSTRACT

A switched attenuator circuit providing three selectable voltage-divider ratios including one which passes substantially 100 percent of the input signal. The circuit places constant load resistance on its source in all positions when driving a high-resistance load. The circuit is inexpensive to construct, comprising three attenuation resistors, two input resistance compensating resistors, and two single-pole double-throw switching elements for changing the series/parallel configuration of the attenuation resistors and switching the compensating resistors into the circuit. The circuit places all parasitic capacitance associated with the switches on the input side of the circuit, thereby providing uniformly low output capacitance for all voltage-divider ratios.

6 Claims, 4 Drawing Figures

LOW IMPEDANCE SWITCHED ATTENUATOR

This invention relates to electrical circuits, and more particularly to an attenuator circuit providing a plurality of selectable voltage-divider ratios.

Signal attenuators are used, for example, in oscilloscopes to adjust the height of a displayed waveform to a convenient value for input waveforms having either large or small peak-to-peak amplitudes. A traditional attenuator circuit providing a plurality of different signal-attenuation ratios includes a network of resistors, selectively switched into or out of the circuit to change the voltage-division ratio, the switches loading an output node of the circuit. A recognized problem in the construction of switched attenuator circuits is the difficulty of maintaining a low output capacitance of the circuit with the addition of stray capacitance introduced with the actuation of additional switching elements.

An object of the present invention is to provide an improved switched attenuator circuit.

Another object of the instant invention is to provide an improved switched attenuator circuit having output capacitance unaffected by stray capacitance of the circuit switching elements.

Yet another object of the present invention is to provide an improved attenuator circuit which incorporates a plurality of selectable attenuation ratios into the circuit while maintaining constant input resistance and output capacitance.

In accordance with one aspect of the present invention, an attenuator circuit includes means coupled between an input node and an output node of the circuit for attenuating, at a first attenuation ratio, an input signal applied to the input node, and means coupled between the input node and the attenuating means for changing the attenuation ratio of the attenuating means. Input resistance compensating means is provided for matching the input resistance of the attenuator circuit at both attenuation ratios, the compensating means being connected in the circuit when the attenuation ratio is changed, in accordance with another aspect of the invention.

In accordance with yet another aspect of the present invention, an attenuator circuit providing at least two selectable attenuation ratios includes a first attenuator resistor coupled between input and output nodes of the circuit, and a second attenuator resistor switchable into parallel relation either with the first resistor or with a third attenuator resistor connected at one end thereof to the output node of the circuit and which third resistor is switchable at the other end thereof between ground and the input node of the circuit. A fourth resistor, selectively switchable into the circuit, is provided for maintaining uniform input resistance for each of the selected attenuation ratios.

DRAWINGS

While the invention is set forth with particularity in the appended claims, other objects, features, the organization and method of operation of the invention will become more apparent, and the invention will best be understood by referring to the following detailed description in conjunction with the accompanying drawings in which:

DESCRIPTION OF THE PREFERRED EMBODIMENT

Figure 1:
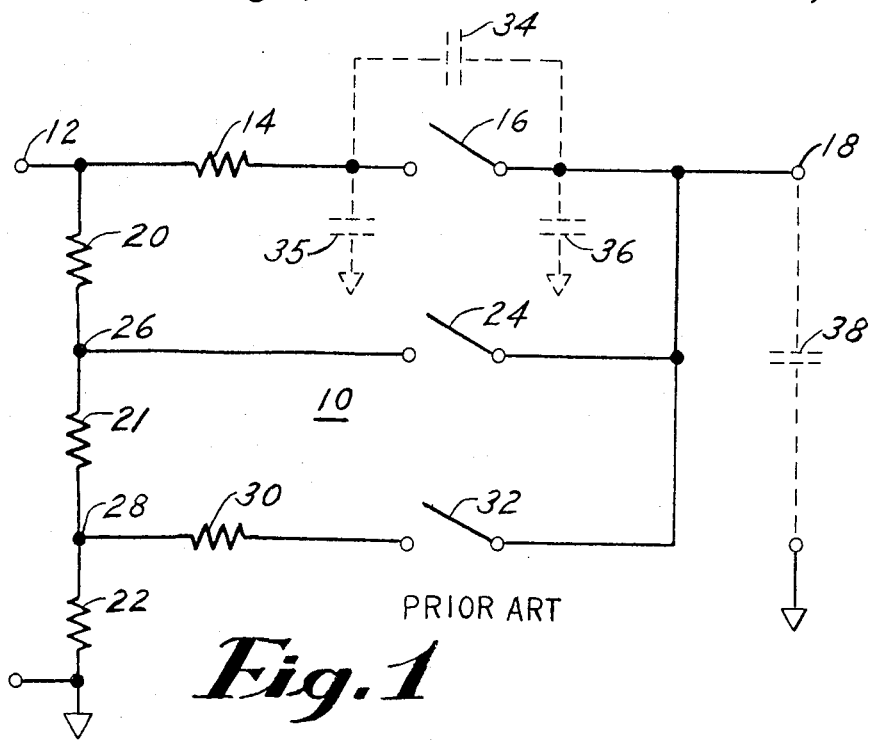
FIG. 1 is a schematic diagram of a conventional switched attenuator circuit.

Referring now to the various views of the drawings for a more detailed description of the components, materials, construction, function, operation and other features of the instant invention by characters of reference, FIG. 1 shows a traditional switched attenuator circuit 10 having an input terminal 12 coupled through a first resistor 14 and a first single-pole, single-throw (SPST) switch 16 to an output terminal 18. The input terminal 12 is also connected through three resistors 20–22 in series to ground, while a second SPST switch 24, when closed, couples a junction or node 26 between the series resistors 20, 21 to the output terminal 18. A junction 28 between the second and third series resistors 21, 22 is connected through a resistor 30 to a third SPST switch 32 which, when closed, couples the resistor 30 to the output terminal 18. The switches 16, 24, 32 are typically either manually actuated switches or electrically operated relays exhibiting stray capacitance as illustrated typically in FIG. 1 by dashed-line capacitances 34, 35, 36 associated with the first switch 16.

The need to keep output capacitance of a circuit such as the circuit of FIG. 1 small is well known in the art. A small or low output capacitance, on the order of say 10 picofarads, results in improved circuit performance. Because the output capacitance is lower, signal rise times are faster and cutoff frequency is higher. However, total output capacitance of the circuit of FIG. 1, as represented by dashed-line capacitance 38 between the output terminal 18 and ground, includes the stray capacitance of the switches 16, 24, 32, typically 2 picofarads for each switch closed, 1 picofarad on each side of the switch. Closing switches increase the total output capacitance.

Figure 2:
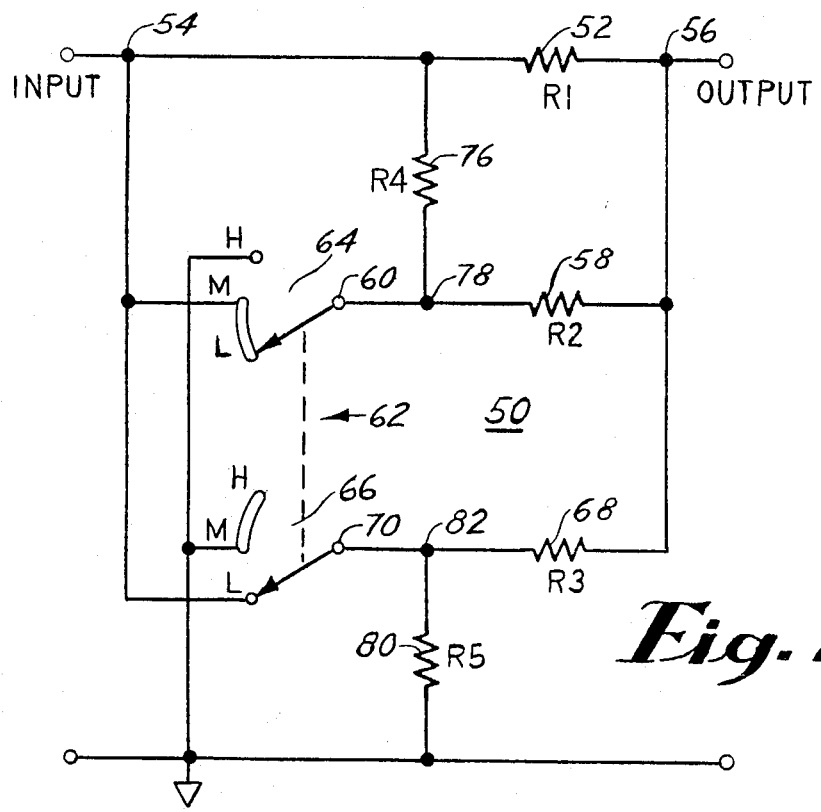
FIG. 2 is a schematic diagram of a switched attenuator circuit according to the instant invention.

Referring now to FIG. 2, a low impedance switched attenuator circuit 50 in accordance with the instant invention comprises a first resistor 52 connected between an input terminal or node 54 and an output terminal 56; a second resistor 58 connected between the output terminal 56 and a wiper terminal 60 of a three-position switch 62 having first and second ganged elements 64, 66; and a third resistor 68 connected between the output terminal 56 and a second wiper terminal 70 of the three-position switch 62. First, second and third contact positions of each of the switch elements 64, 66 of the switch 62 are designated, respectively, L, M, and H, representing Low, Medium, and High attenuation ratios of the circuit 50. The terms low, medium and high refer to attenuation ratios ordered with respect only to the three positions of the switch 62, and do not refer to any intrinsic value of voltage division or attenuation.

The switch 62 suitably may be a manually operated two-element, ganged wafer switch. In the first position L of both the switch elements 64, 66 the wipers 60, 70 are connected to the input node 54, while in the third position H, the wipers 60, 70 are connected to ground. In the second position M of the switch elements 64, 66, the wipers 60, 70 are connected, respectively, to the input node 54 and to ground. A fourth resistor 76 is connected between the input node 54 and a node 78 intermediate the wiper terminal 60 of the switch 62 and the resistor 58, and a fifth resistor 80 is connected between ground and a node 82 intermediate the wiper terminal 70 of the switch 62 and the resistor 68.

The resistors 52, 58, 68, 76 and 80 are alternatively referred to herein, respectively, as R1–R5. Typical values for the resistors R1–R5 are as follows:

R1 375 ohms
R2 250 ohms
R3 150 ohms
R4 833 ohms
R5 300 ohms

The values of R1, R2, and R3 are chosen to yield the desired signal attenuation ratios in the medium and high loss positions of the switch 62, while the value of R5 is chosen to set the input resistance of the circuit 50 in the low-loss position. The switch 62 is shown in FIG. 2 in the L or low-loss position with the respective wipers 60, 70 contacting the L terminals, thereby connecting R1, R2 and R3 in parallel between the input 54 and output 56 nodes, and R5 (300 ohms) between the input node 54 and ground, resulting in an input resistance of about 300 ohms and an output resistance of 375 ohms. In the low-loss position virtually 100 percent of the input signal is passed to the output node 56. The input impedance of the circuit in the low-loss position may be otherwise compensated by substituting a resistance-capacitance network for the resistor R5.

When the switch 62 is in the M or medium-loss position, resistor R2 is connected in parallel with resistor R1 between the input 54 and output 56 nodes providing 150 ohms resistance therebetween, and R3 is connected between the output node 56 and ground, forming a voltage divider circuit wherein the output voltage taken across resistor R3 (150 ohms) is one-half the peak-to-peak, input-signal voltage applied at the input across the total circuit resistance of 300 ohms. The circuit 50 thus provides a signal-attenuation ratio of 2:1 when the switch 62 is in the medium-loss position. Resistors R4 and R5 are effectively not connected in the circuit in the medium-loss position, being shorted, respectively, by the elements 64, 66 of switch 62.

The high-loss position H of the switch 62 connects resistors R2 and R3 in parallel between the ouput node 56 and ground, while connecting resistor R4 between the input node 54 and ground. R1 remains in the circuit. The value of the resistor R4 is chosen so as to make the input resistance of the circuit 50 in the high-loss position match the input resistance of the medium-loss position, i.e., 300 ohms in the presently described embodiment of the invention. It will be seen that an impedance comprising a capacitor or a resistor-capacitor network may be substituted for the resistor R4 to compensate the input impedance of the circuit 50 in the high-loss position. The input resistance of the circuit 50 in the high-loss position comprises resistor R4 in parallel with the series circuit which includes resistor R1 in series with the parallel combination of resistors R2 and R3. The output voltage of the circuit 50 in the high-loss position is taken across the resistors R2 and R3 in parallel, 93.75 ohms in the presently described embodiment of the invention, the total resistance across the voltage divider circuit being 468.75 ohms. The signal-attenuation ratio for the high-loss position of the circuit 50 is therefore 5:1.

The attenuator circuit 50 of the present invention thus provides three different attenuation ratios, including one which passes virtually 100 percent of the output signal. The circuit provides constant output resistance when driven from zero source resistance, and constant load resistance on its source when driving a high-resistance load (1 megohm or greater). The attenuation ratios are predetermined by the values of the resistors R1–R5, the calculation of which is straightforward by selecting the desired attenuation ratios and solving simultaneous linear equations in five unknowns.

While the switching element 62 of the FIG. 2 suitably may be a manually operated wafer switch having ganged elements as previously described, a best mode embodiment of the present invention utilizes two conventional, electrically actuated single-pole, double-throw (SPDT) relays, viz.: DS series relays manufactured by Aromat. It should be noted that the circuit of the instant invention places all stray capacitance associated with the switching devices on the input side of the circuit.

Figure 3:
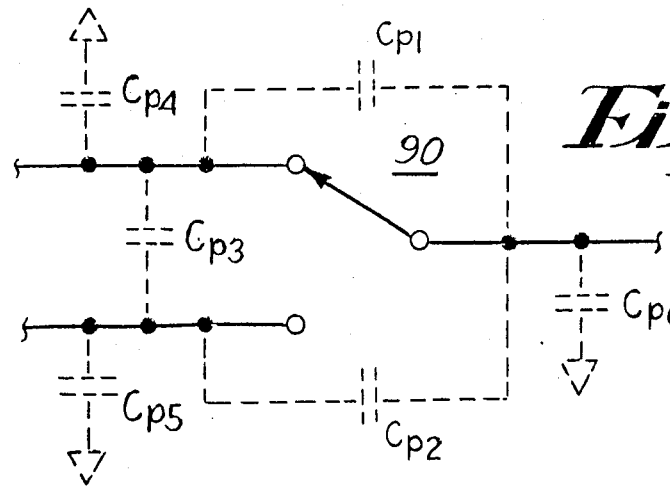
FIG. 3 is a schematic diagram of a typical switching element showing parasitic capacitance.
Figure 4:
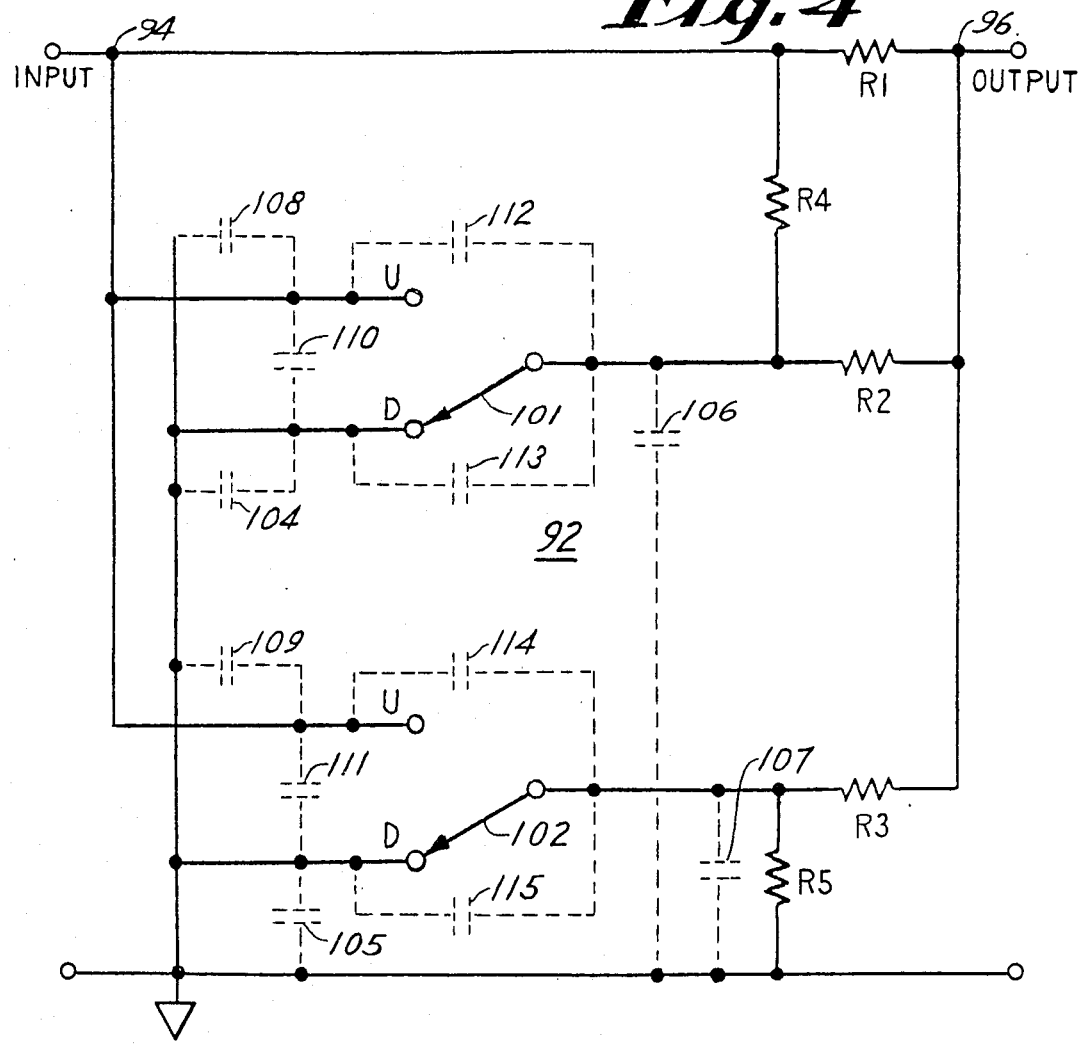
FIG. 4 is a schematic diagram of another embodiment of a switched attenuator circuit according to the present invention.

Referring to FIG. 3, a typical single-pole, double-throw (SPDT) switch 90 is shown having parasitic capacitances $C_{p1}$–$C_{p3}$ between the switch contacts, and $C_{p4}$–$C_{p6}$ between individual contacts and ground. Referring to FIG. 4, a circuit 92 represents the switch circuit 90 of FIG. 3 substantially substituted into the circuit 50 of FIG. 2.

Referring further to FIG. 4, an alternate embodiment of the present invention comprises a circuit 92 similar to the embodiment described with reference to FIG. 2, but utilizing SPDT switches, and includes an input signal node 92, an output signal node 94, the attenuating resistors R1–R3 and the input resistance compensating resistors R4 and R5. Two SPDT relays 101, 102 are utilized for switching elements, electrically-operated relays being preferable to manual switches because attenuation ratios may be selected rapidly and automatically under computer control.

In FIG. 4, the switches 101, 102 are each shown in a first position with the respective wipers contacting lower terminals (as oriented in the figure) labeled D, upper terminals of the switches 101, 102 correspondingly being labeled U. Accordingly, the switches 101, 102 are termed herein as being in the down or D position when actuated as shown in FIG. 1, while being in the up or U position when the wipers contact the upper terminals. In FIG. 4, the circuit 92 is shown in the high loss position; in the presently described embodiment of the invention, the positions of the switches 101, 102 affect transmission loss of the circuit 92 as follows:

| SWITCH POSITIONS | | | |
|---|---|---|---|
| LOSS | S101 | S102 | ATTEN. RATIO |
| Low Loss | U | U | 1:1 |
| Medium Loss | U | D | 2:1 |
| High Loss | D | D | 5:1 |
| Not Used | D | U | |

Although the fourth position of the switches S101, S102 provides a fourth attenuation ratio, the position is not used in the presently described embodiment.

Parasitic capacitances 104–115 associated with the switches 101, 102 are shown in dashed line in FIG. 4. Contact capacitances 104, 105 are shorted to ground, as are contact capacitances 106, 107 when the switches 101, 102 are in the D position; when the switches are in the U position, the contact capacitances 106, 107 are connected between the input node 94 and ground. Contact capacitances 108, 109 are connected between the input node and ground, as are interelectrode capacitances 110, 111. The remaining interelectrode capacitances 112-115 are either connected between the input node 94 and ground or shorted depending on the position of the switches 101, 102.

It is evident that all the stray capacitances have either both terminals thereof grounded, or one terminal loading the input node and the other grounded. No stray capacitance loads the output node. This is seen to be true in either embodiment. Capacitive loading of the input node is preferred because the previous stage can be designed to drive capacitive loads with little performance degradation. On the other hand, capacitance on the ouput node forms a low pass filter section with the output resistance of the circuit, as is evident with the prior art shown in FIG. 1, resulting in considerable performance degradation when compared with the circuit of the instant invention. The circuit 50 of FIG. 2 typically exhibits much faster response at the output node, being limited only by the output capacitance and the speed of the input signal source, e.g., output-signal rise times on the order of 1.3 nanoseconds with an entering signal rise time of 1.2 nanoseconds are typical. Output capacitance is typically 8 to 10 picofarads, with no additional stray capacitance (being introduced) from the switching elements.

While the principles of the invention have now been made clear in the foregoing illustrative embodiment, there will be immediately obvious to those skilled in the art many modifications of structure, arrangement, proportions, the elements and components used in the practice of the invention, and otherwise, which are particularly adapted for specific environments and operating requirements without departing from those principles. The appended claims are, therefore, intended to cover and embrace any such modifications, within the limits only of the true spirit and scope of the invention.

We claim:

1. An attenuator circuit, comprising:
a signal input node;
a signal output node;
a voltage divider network coupled between said input node and said output node, said voltage divider network including
a first attenuator resistor connected between said input node and said output node;
a second attenuator resistor connected at one end thereof to said output signal node, and coupled at another end thereof to ground;
a third attenuator resistor connected at one end thereof to said signal output node;
a switching element coupled between said input node and said voltage divider network, said switching element including a first switch having a wiper connected to another end of said second attenuator resistor, a first contact connected to said input signal node, and a second contact connected to ground, said first switch being in a first position when the wiper contacts the first contact and a second position when the wiper contacts the second contact; and
a compensating resistor connected between said input node and the wiper of said first switch, said voltage divider network providing a first ratio of attenuation when said first switch is in the first position and a second ratio of attenuation when said first switch is in the second position, said attenuator circuit having an input resistance which is the same for both the first and second attenuation ratios.

2. The attenuator circuit of claim 1, comprising:
a second compensating resistor connected between the other end of said third attenuation resistor and ground; and
a second switch having a first contact connected to ground, a second contact connected to said input signal node, and a wiper connected to the other end of said third attenuator resistor, said second switch being in a first position when the wiper of said second switch contacts the first contact thereof and a second position when the wiper of said second switch contacts the second contact thereof, said third attenuator resistor being coupled to ground through said second switch when said second switch is in the first position, said voltage divider network providing a third ratio of attenuation when said first switch is in the first position and said second switch is in the second position, said attenuator circuit having an input resistance which is the same for the third attenuation ratio as for the first and second attenuation ratios.

3. The attenuator circuit of claim 2 wherein the third attenuation ratio is 1:1.

4. The attenuator circuit of claim 3 wherein the second attenuation ratio is 5:1 and the first attenuation ratio is 2:1.

5. The attenuator circuit of claim 1 wherein the first attenuation ratio is 2:1.

6. The attenuator circuit of claim 1 wherein the second attenuation ratio is 5:1.

* * * * *